(12) United States Patent
Yang et al.

(10) Patent No.: US 7,757,750 B2
(45) Date of Patent: Jul. 20, 2010

(54) INTEGRATED COOLING SYSTEM FOR ELECTRONIC COMPONENTS

(75) Inventors: Chih-Hao Yang, Tu-Cheng (TW); Chao-Nien Tung, Tu-Cheng (TW); Chuen-Shu Hou, Tu-Cheng (TW); Tay-Jian Liu, Tu-Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 1033 days.

(21) Appl. No.: 11/309,293

(22) Filed: Jul. 21, 2006

(65) Prior Publication Data
US 2007/0158051 A1   Jul. 12, 2007

(30) Foreign Application Priority Data
Jan. 6, 2006   (CN) ..................... 2006 1 0032810

(51) Int. Cl.
  *H05K 7/20*   (2006.01)
(52) U.S. Cl. ............ 165/104.26; 165/80.3; 165/104.33; 361/700
(58) Field of Classification Search ................ 165/80.3, 165/104.26, 104.33; 361/700
See application file for complete search history.

(56) References Cited

U.S. PATENT DOCUMENTS

| | | | | |
|---|---|---|---|---|
| 3,613,778 A | * | 10/1971 | Feldman, Jr. ........... | 165/104.26 |
| 5,582,242 A | * | 12/1996 | Hamburgen et al. ... | 165/104.21 |
| 5,720,338 A | * | 2/1998 | Larson et al. .................. | 165/46 |
| 6,005,772 A | * | 12/1999 | Terao et al. .................. | 361/699 |
| 6,227,288 B1 | | 5/2001 | Gluck et al. | |
| 6,863,119 B2 | * | 3/2005 | Sugito et al. ........... | 165/104.33 |
| 7,028,759 B2 | * | 4/2006 | Rosenfeld et al. ...... | 165/104.26 |
| 2003/0168207 A1 | * | 9/2003 | Wang ..................... | 165/104.26 |
| 2005/0126760 A1 | * | 6/2005 | Makino et al. ......... | 165/104.26 |
| 2006/0289147 A1 | * | 12/2006 | Zuo et al. ............... | 165/104.26 |

* cited by examiner

*Primary Examiner*—Allen J Flanigan
(74) *Attorney, Agent, or Firm*—Jeffrey T. Knapp

(57) ABSTRACT

A cooling system for removing heat from a heat generating component, includes a base (100) and a heat sink (200) mounted on the base. The base includes a bottom wall (20) and a side wall (10) surrounding the bottom wall. The bottom wall and the side wall cooperatively define a space (40) receiving working fluid therein. The heat sink defines an evaporating passage (220) and a condensing passage (230) therein. The two passages are in fluid communication with the space. Cooperatively the space and the passages define a loop for circulating the working fluid therein. The working fluid has a phase change for dissipating heat generated by a heat-generating electronic component.

17 Claims, 4 Drawing Sheets

INTEGRATED COOLING SYSTEM FOR ELECTRONIC COMPONENTS

FIELD OF THE INVENTION

The present invention relates generally to a cooling device, and more particularly to a cooling system with an integrated structure. The cooling system can be suitably applied for removing heat from heat generating electronic components.

DESCRIPTION OF RELATED ART

Along with fast developments in electronic information industries, electronic components such as central processing units (CPUs) of computers are made capable of operating at a much higher frequency and speed. As a result, the heat generated by the CPUs during normal operation is commensurately increased. If not quickly removed away from the CPUs this generated heat may cause them to become overheated and finally affect the workability and stability of the CPUs. In order to remove the heat of the CPUs and hence keep the CPUs in normal working order, cooling devices must be provided to the CPUs to dissipate heat therefrom. Conventionally, extruded heat sinks combined with electric fans are frequently used for this heat dissipation purpose. However, these conventional cooling devices are unsatisfactory at cooling down the current high speed CPUs.

It is well known that the heat transfer efficiency by phase change of liquid (i.e. from liquid to vapor) is hundred times more than that of other mechanisms, such as heat conduction or heat convection without phase change. Accordingly, cooling devices with phase change have been developed. As a more effective cooling device, the cooling system generally includes a heat absorbing member filled with liquid coolant and a heat dissipating member. In practice, these components are connected together in series by a plurality of pipes so as to form a heat transfer loop through which a coolant is circulated. The heat absorbing member is maintained in thermal contact with a heat generating component such as a CPU for absorbing the heat generated by the heat generating component. The working fluid in the heat absorbing member absorbs heat and becomes vapor. The vapor flows through the heat transfer loop to the heat dissipating member so as to bring the heat of the heat generating component from the heat absorbing member to the heat dissipating member for dissipation. The vapor is then condensed into liquid and flows back to the heat absorbing member so as to be available again for heat absorption from the heat generating component.

However, this cooling system still has the following drawbacks. Since the heat absorbing member and the heat dissipating member are connected together by a large number of pipes, it is difficult to give the resultant cooling system a satisfactorily compact structure. The requirement of the large number of pipes also adds assembly complexity to the cooling system and raises the chance of liquid leakage at the joints between the pipes and the components (i.e. the heat absorbing member and the heat dissipating member) of the cooling system. In assembly, mounting of the cooling system will be a tiresome and time-consuming work since the components of the cooling system are required to be addressed individually. Similarly, if the cooling system requires dismounting for purposes of repair or replacement, the components of the cooling system also require individual dismounting.

Therefore, it is desirable to provide a cooling system which overcomes the aforementioned disadvantages.

SUMMARY OF THE INVENTION

The present invention relates to a cooling system for removing heat from a heat generating component. The cooling system includes a base and a heat sink mounted on the base. The base includes a bottom wall and a side wall surrounding the bottom wall. The bottom wall and the side wall cooperatively define a space receiving working fluid therein. The heat sink defines an evaporating passage and a condensing passage therein. The two passages are in fluid communication with the space. The space and the passages cooperatively define a loop for circulating the working fluid therein. In the present cooling system, the components thereof, i.e. the base, the heat sink, etc., are combined together to form an integrated structure without using any connecting pipes.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present cooling system can be better understood with reference to the following drawings. The components in the drawings are not necessarily drawn to scale, the emphasis instead being placed upon clearly illustrating the principles of the present cooling system. Moreover, in the drawings, like reference numerals designate corresponding parts throughout the several views.

DETAILED DESCRIPTION OF THE INVENTION

Figure 1:
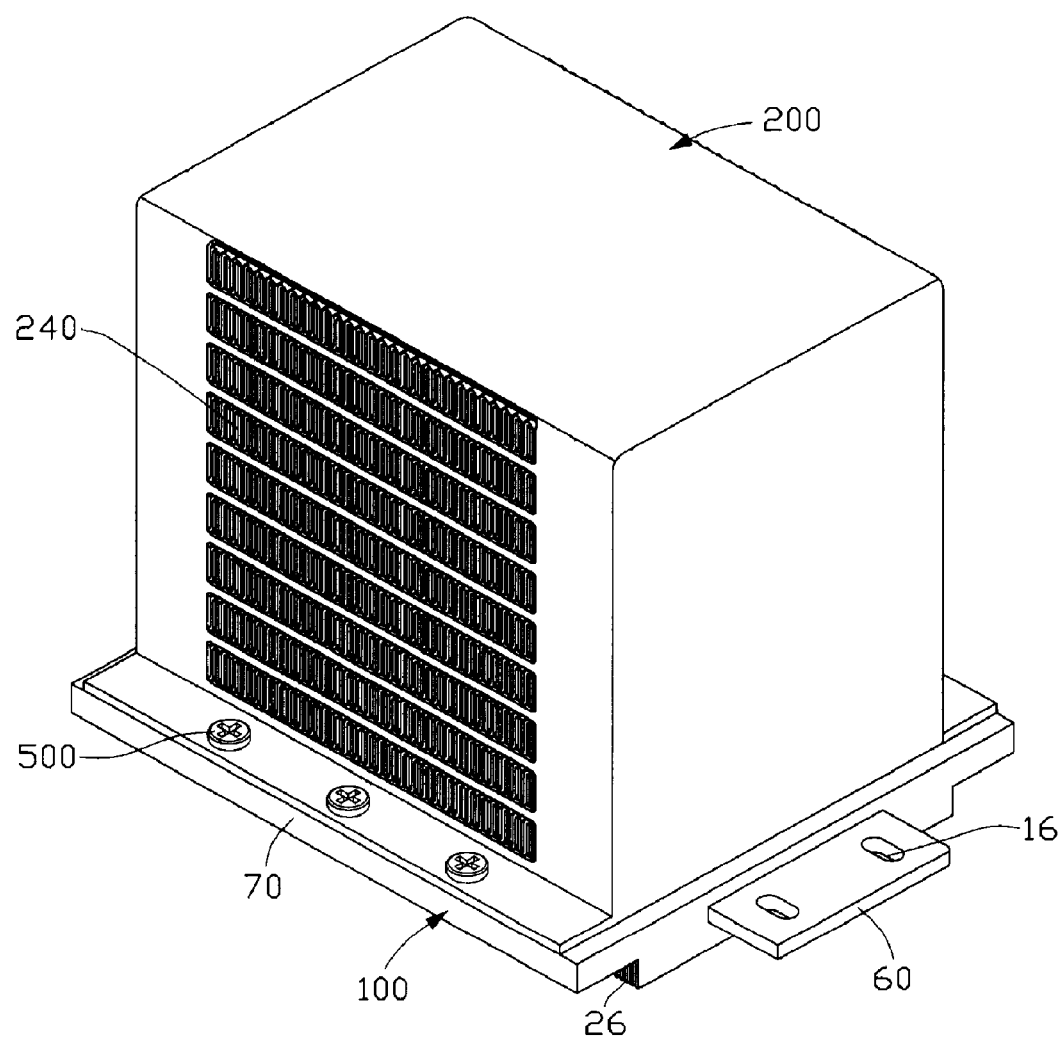
FIG. 1 is an isometric view of a cooling system in accordance with one embodiment of the present invention.
Figure 2:
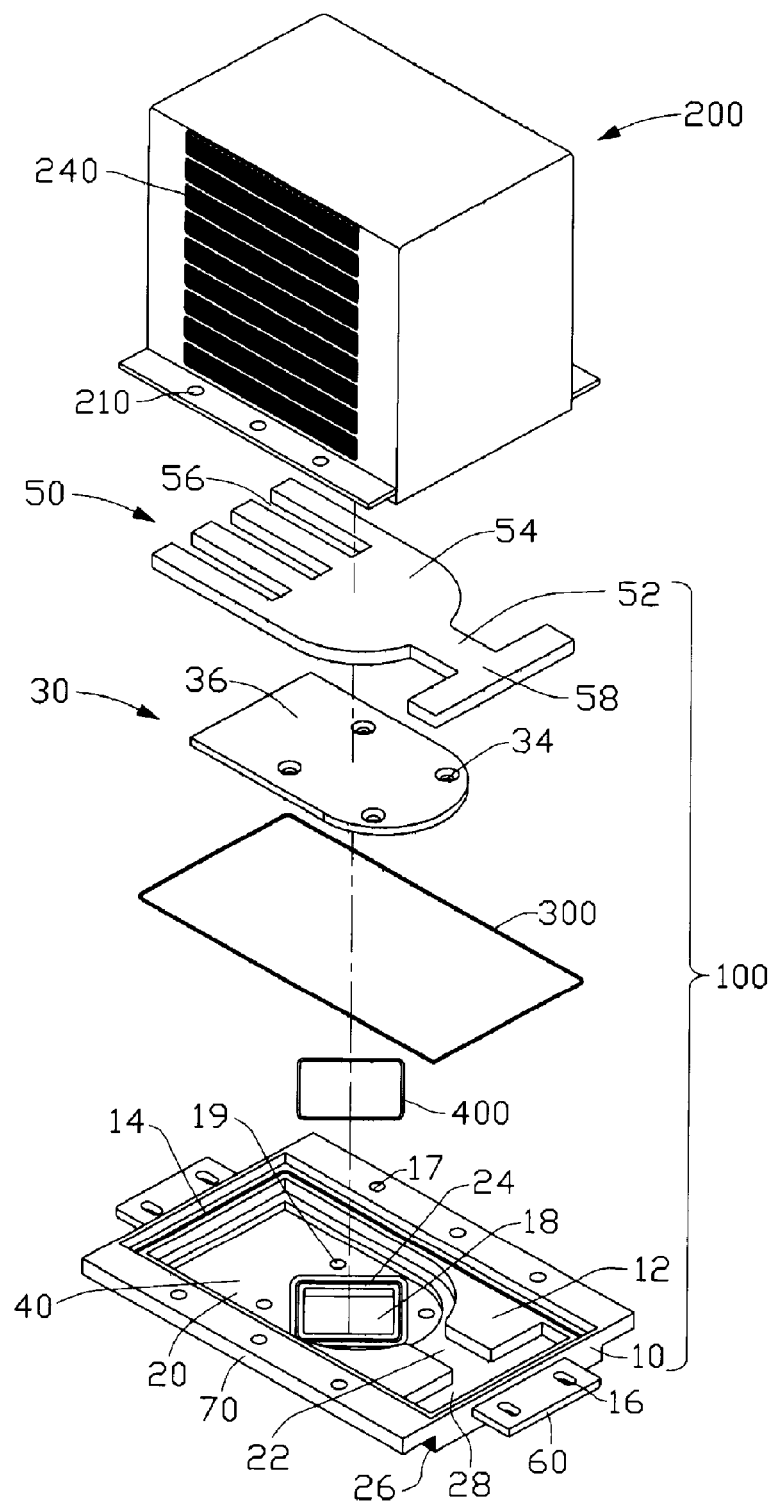
FIG. 2 is an exploded, isometric view of the cooling system of FIG. 1.
Figure 3:
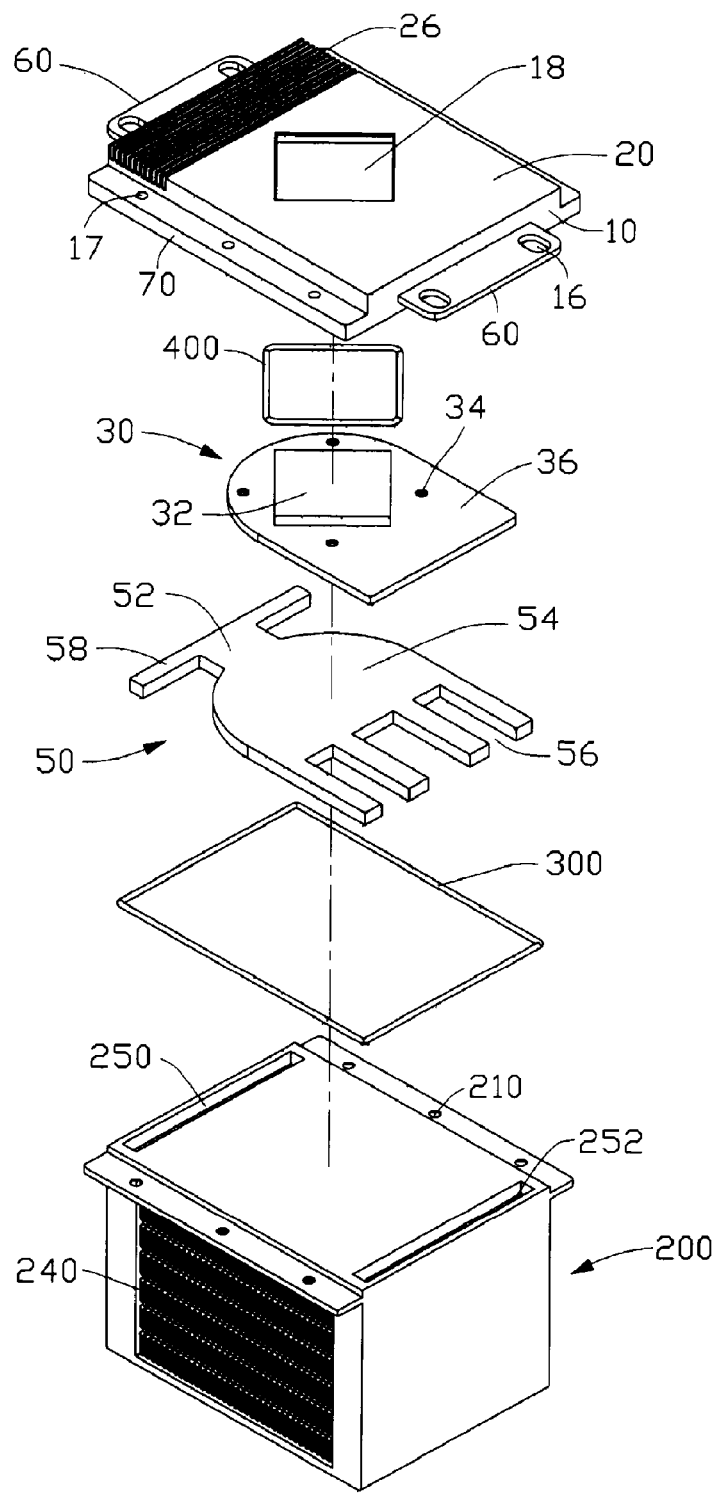
FIG. 3 is similar to FIG. 2, but viewed from another aspect.

FIGS. 1-3 illustrate a cooling system in accordance with a preferred embodiment of the present invention. The cooling system has an integrated structure, which includes a base 100 and a heat sink 200 mounted on the base 100. The base 100 is substantially square shaped. The base 100 includes a pair of screwing sides 60 located at left and right sides, and a pair of mounting sides 70 at front and rear sides thereof. Each screwing side 60 defines a pair of screwing holes 16 for extension of screwing members (not shown) therethrough so as to mount the cooling system to a heat generating component, such as CPU (not shown). Each mounting side 70 defines three mounting holes 17 therein. A through hole 210 is defined in the heat sink 200 corresponding to each mounting hole 17 of the base 100. Screws 500 extend through the through holes 210 and the mounting holes 17 so as to lock the heat sink 200 with the base 100 when the cooling system is assembled together.

The base 100 includes a bottom wall 20 and a side wall 10 surrounding the bottom wall 20. Cooperatively the side wall 10 and the bottom wall 20 define a space 40 receiving working fluid therein. The bottom wall 20 includes a central portion and a peripheral portion around the central portion. The peripheral portion is higher than the central portion, and thus the bottom wall 20 makes a step-shape. A diamond-shaped opening 18 is defined in the central portion of the bottom wall 20. A groove 24 is defined in the bottom wall 20 around the opening 18 for receiving a first fluid-tight seal 400 therein. A circular hole 19 is defined in the central portion of the bottom wall 20 adjacent to each side of the opening 18. The peripheral portion has a pair of protrusions 12 extending inwardly from each mounting side 70 of the base 100. The protrusions 12 define a channel 22 therebetween. The protrusions 12 are located adjacent to and spaced from the right screwing side 60. A chamber 28 is defined between the protrusions 12 and the right screwing side 60 of the base 100. The channel 22 communicates the chamber 28 with the space 40 of the base 100. A second groove 14 is defined in the side wall 10 of the base 100 for receiving a second fluid-tight seal 300 therein. Furthermore the base 100 includes a fin unit 26 which extends downwardly from a bottom surface of the bottom wall 20. The fin unit 26 is formed adjacent to the right screwing side 60 of the base 100 corresponding to the chamber 28.

The base 100 further includes a heat spreader 30 received therein. The heat spreader 30 is made of a material having relatively high heat conductivity, such as copper, for enhancing the speed of heat transfer from the heat generating component to the cooling system. The heat spreader 30 includes a main body 36 having a shape conforming to that of the central portion of the bottom wall 20 of the base 100. A contacting portion 32 extends downwardly from the main body 36 for thermally attaching to the heat generating component. The contacting portion 32 has a shape and size similar to that of the opening 18 of the bottom wall 20. Four fixing holes 34 are defined in the main body 36 of the heat spreader 30 corresponding to the circular holes 19 of the base 100.

A wick structure 50 is arranged in the space 40 of the base 100 for generating capillary force to absorb condensed working fluid returning back. The wick structure 50 can be made of waved wires or sintering powders. The wick structure 50 includes a comb-shaped main portion 54, an end portion 58, and a neck portion 52 interconnected therebetween. The main portion 54 of the wick structure 50 has a size approximately the same as the main body 36 of the heat spreader 30 and mounted thereon. Several cutouts 56 are defined in the main portion 54 of the wick structure 50. The neck portion 52 is received in the channel 22, and the end portion 58 is received in the chamber 28 of the peripheral portion of the base 100.

Figure 4:
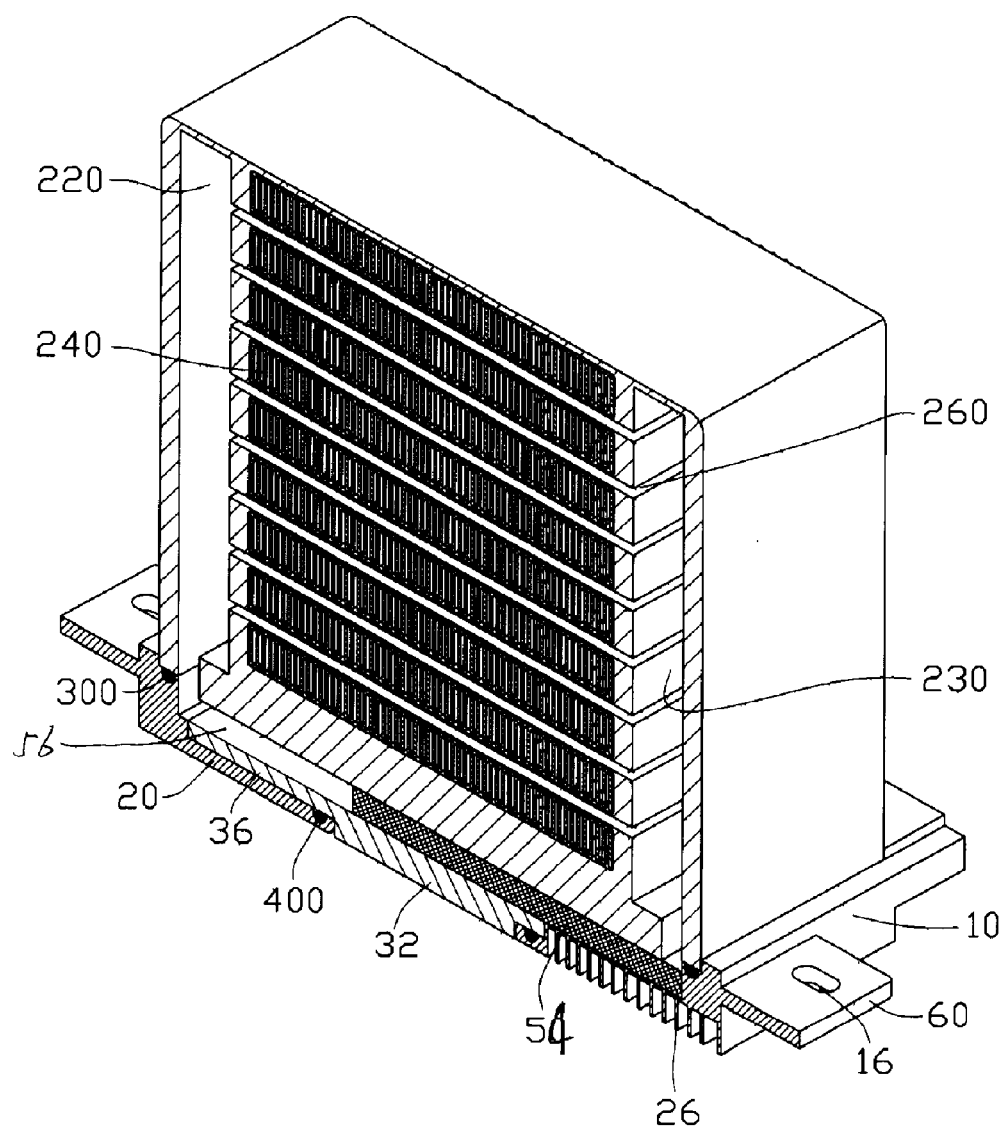
FIG. 4 is a sectioned isometric view of a heat dissipating member of the cooling system of FIG. 1.

With reference to FIGS. 2-4, the heat sink 200 includes a plurality of connecting conduits 260 disposed in parallel with each other and evaporating, condensing passages 220, 230, located to left and right of these connecting conduits 260. A fin member 240 is located between two neighboring upper and lower connecting conduits 260. The fin member 240 is maintained in thermal contact with the corresponding connecting conduits 260. Each of the connecting conduits 260 is connected with the evaporating and condensing passages 220, 230. The passages 220, 230 define apertures 250, 252 at the bottom end of the heat sink 200, respectively, to communicate the passages 220, 230 with the space 40 of the base 100. Thus the space 40 of the base 100, the evaporating passage 220, the connecting conduits 260 and the condensing passage 230 cooperatively define a loop for circulating the working fluid. The evaporating passage 220 is communicated with the cutouts 56 of the main portion 54 of the wick structure 50.

During assembly, the heat spreader 30 is arranged in the central portion of the base 100 with the contacting portion 32 extending through the opening 18. Screw members (not shown) extends through the fixing holes 34 of the heat spreader 30 into the circular holes 19 of the base 100 to assemble the heat spreader 30 to the base 100. The first fluid-tight seal 400 is received in the first groove 24 of the base 100 for fluid-tight sealing. The wick structure 50 is arranged on the heat spreader 30 with working fluid filled therein. Thus the base 100 is assembled together. When the heat sink 200 is mounted on the base 100, the second fluid-tight seal 300 is arranged in the second groove 14 of the base 100. Thus the second fluid-tight seal 300 is located between the base 100 and the heat sink 200 for fluid-tight sealing. In operation, the contacting portion 32 of the heat spreader 30 is thermally attached to the heat generating component to absorb heat generated thereby. The heat is quickly and evenly conducted to the main body 36 of the heat spreader 30 due to its excellent heat conductivity. The working fluid saturated in main portion 54 of the wick structure 50 absorbs heat from the heat spreader 30 and evaporates into vapor. The vapor moves upwardly from the base 100 to the heat sink 200 along the cutouts 56 of the main portion 54 of the wick structure 50 and the evaporating passage 220. Then the vapor is distributed amongst the connecting conduits 260. As the vapor flows through the connecting conduits 260, the heat of the vapor is released to the fin members 240 of the heat sink 200. The vapor condenses into condensed working fluid and then flows back along the condensing passage 230. The condensed working fluid flows through the aperture 252 into the base 100 in a manner so as to be available again for heat absorption from the heat generating component, whereby the heat is continuously removed away as the working fluid is circulated continuously along the heat transfer loop of the cooling system. The condensed working fluid flowing back to the base 100 is first received by the end portion 58 of the wick structure 50. Then it flows backs to the main portion 54 of the wick structure 50 via the neck portion 52 thereof. As the wick structure 50 forms the neck portion 52 and the cutouts 56, the flow resistance of the vapor flowing into the evaporating passage 220 is relatively small compared to that of the vapor flows into the condensing passage 230. Thus the vapor is unlikely to flow to the heat sink 200 through the condensing passage 230. The fin unit 26 is arranged on the base 100 immediately below the chamber 28; thus even if there is still any vapor flowing to the chamber 28, the heat of the vapor is released to the fin unit 26 and then to the environment. The vapor flowing to the chamber 28 is then condensed into liquid in the chamber 28 of the base 100. Thus the flowing direction of the vapor is one-way only. This avoids the condensed fluid impeding the vapor flow, thus improving the heat dissipation efficiency of the cooling system.

In the present cooling system, the base 100 and the heat sink 200 are connected together without using any connecting pipes. Therefore, the components of the cooling system can be assembled easily to form an integrated and compact structure, as shown in FIG. 1. Since no connecting pipes are required in the present cooling system, the liquid leakage problem associated with the pipe connections in the prior art is also eliminated. Furthermore, by using only a limited number of screw members, the cooling system as a whole can be easily mounted to the computer in which the CPU is installed for removing heat from the CPU, and can be just as easily dismounted from the computer when the cooling system needs repair or maintenance.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A cooling system for removing heat from a heat generating component, comprising:
   a base comprising a bottom wall and a side wall surrounding the bottom wall, the bottom wall and the side wall cooperatively defining a space receiving working fluid therein; and
   a heat sink mounted on the base, the heat sink defining an evaporating passage and a condensing passage therein, the two passages being in fluid communication with the space of the base, cooperatively the space and the passages defining a loop for circulating the working fluid therein, the working fluid receiving heat and becoming vapor in the space, the vapor flowing first to the evaporating passage and then condensing into liquid when flowing from the evaporating passage to the condensing passage, the liquid then flowing from the condensing passage back to the space;
   wherein a wick structure is received in the space of the base;
   wherein the base defines an opening therein, and a heat spreader arranged on the base has a contacting portion extending through the opening for thermally attaching to the heat generating component; and
   wherein the bottom wall of the base comprises a central portion on which the spreader is mounted, and a peripheral portion, the peripheral portion being higher than the central portion and thus making a step-shape.

2. The cooling system of claim 1, wherein a fluid-tight seal is arranged between the spreader and the bottom wall to create a fluid-tight seal between the spreader and the bottom wall.

3. The cooling system of claim 2, wherein a groove is defined in the bottom wall receiving the fluid-tight seal therein.

4. The cooling system of claim 1, wherein a pair of protrusions extend inwardly from two opposing sides of the side wall of the base into the space, and define a channel therebetween.

5. The cooling system of claim 4, wherein the channel is located at a lateral side of the opening, and the wick structure comprises a main portion arranged on the spreader and a neck portion received in the channel of the base.

6. The cooling system of claim 5, wherein the main portion of the wick structure is comb-shaped, and a plurality of cutouts are defined in the main portion.

7. The cooling system of claim 4, wherein the protrusions are spaced from a side of the base different from the sides from which the protrusions extend, and a chamber communicating with the channel is defined between the protrusions and the side of the base.

8. The cooling system of claim 7, wherein a fin unit extends from a portion of a bottom side of the base corresponding to the chamber.

9. The cooling system of claim 7, wherein the condensing passage faces and is in fluid communication with the chamber.

10. The cooling system of claim 1, wherein the heat sink comprises a plurality of connecting conduits disposed in parallel with each other, and the evaporating and condensing passages are in fluid communication with and are located at two opposite sides of the connecting conduits.

11. The cooling system of claim 10, wherein the heat sink further includes a fin member sandwiched between and thermally connecting with every adjacent two connecting conduits.

12. The cooling system of claim 1, wherein a fluid-tight seal is arranged between the heat sink and the base to create a fluid-tight seal between the heat sink and the base, and the base defines a second groove receiving the fluid-tight seal therein.

13. The cooling system of claim 6, wherein the cutouts of the main portion of the wick structure are communicated with the evaporating passage of the heat sink.

14. A cooling system comprising:
   a base defining a space therein;
   a wick structure received in the space of the base and defining an end portion and at least a cutout opposite the end portion;
   a heat sink mounted on the base, having an evaporating passage communicating with the cutout, a condensing passage communicating with the end portion and a plurality of connecting conduits interconnecting the evaporating and condensing passages;
   working fluid received in the wick structure; and
   a plurality of fins thermally connecting with the connecting conduits;
   wherein the working fluid absorbs heat to become vapor, the vapor flowing to the evaporating passage via the at least a cutout, then condensing to liquid when flowing from the evaporating passage to the condensing passage, the liquid flowing from the condensing passage to the end portion of the wick structure;
   wherein the base comprises a bottom wall and a sidewall extending from the bottom wall to the heat sink, the bottom wall being step-shaped, and comprising a central portion defining an opening and a peripheral portion higher than the central portion; and
   wherein a heat spreader is arranged on the central portion of the bottom wall and has a contacting portion extending through the opening for thermally attaching to a heat generating component.

15. The cooling system of claim 14, wherein a plurality of fins are attached to the base at a location corresponding to the end portion of the wick structure.

16. The cooling system of claim 15, wherein a neck is formed on the wick structure between the end portion and the at least a cutout of the wick structure.

17. The cooling system of claim 16, wherein the heat spreader is located between the wick structure and the base.

* * * * *